(12) United States Patent
Stefanov et al.

(10) Patent No.: US 6,989,572 B2
(45) Date of Patent: Jan. 24, 2006

(54) SYMMETRICAL HIGH FREQUENCY SCR STRUCTURE

(75) Inventors: Evgueniy Nikolov Stefanov, Vieille Toulouse (FR); Rene Escoffier, Mauzac (FR)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 12 days.

(21) Appl. No.: 10/615,171

(22) Filed: Jul. 9, 2003

(65) Prior Publication Data

US 2005/0006706 A1  Jan. 13, 2005

(51) Int. Cl.
H01L 23/62  (2006.01)
(52) U.S. Cl. ...................... 257/355; 257/173
(58) Field of Classification Search ............... 257/146, 257/165, 166, 173, 355, 546
See application file for complete search history.

(56) References Cited

U.S. PATENT DOCUMENTS

| 4,246,594 | A | * | 1/1981 | Mori ........................... 257/162 |
| 5,072,273 | A | | 12/1991 | Avery |
| 5,452,171 | A | | 9/1995 | Metz et al. |
| 5,541,801 | A | | 7/1996 | Lee et al. |
| 5,572,394 | A | | 11/1996 | Ker et al. |
| 5,576,557 | A | | 11/1996 | Ker et al. |
| 5,602,404 | A | | 2/1997 | Chen et al. |
| 5,742,085 | A | | 4/1998 | Yu |
| 5,844,280 | A | | 12/1998 | Kim |
| 5,959,821 | A | | 9/1999 | Voogel |
| 6,268,992 | B1 | | 7/2001 | Lee et al. |
| 6,323,074 | B1 | | 11/2001 | Jiang et al. |
| 6,365,924 | B1 | * | 4/2002 | Wang et al. ................ 257/110 |
| 6,365,940 | B1 | * | 4/2002 | Duvvury et al. ............ 257/356 |
| 6,610,578 | B2 | * | 8/2003 | Norstrom et al. ........... 438/369 |
| 2002/0153671 | A1 | | 10/2002 | Raymond et al. |
| 2002/0154463 | A1 | | 10/2002 | Mergens et al. |
| 2003/0062622 | A1 | * | 4/2003 | Pavier et al. ............... 257/734 |

OTHER PUBLICATIONS

IEEE Electron Device Letters, vol. 12, No. 1, Jan. 1991, pp. 21-22, Chatterjee et al., "A Low-Voltage Triggering SCR for On-Chip ESD Protection at Output and Input Pads".

IEEE Transactions on Electron Devices, vol. 43, No. 4, Apr. 1996, pp. 588-598, Ker et al., "Complementary-LVTSCR ESD Protection Circuit for Submicron CMOS VLSI/ULSI".

* cited by examiner

*Primary Examiner*—Tom Thomas
*Assistant Examiner*—Matthew E. Warren
(74) *Attorney, Agent, or Firm*—Kevin B. Jackson (57) ABSTRACT

In one embodiment, an SCR device (41) includes a p+ wafer (417), a p− layer (416), an n+ buried layer (413) and an n− layer (414). P− wells (411,421) are formed in the n− layer (414). N+ regions (412,422) and p+ regions (415,425) are formed in the p− wells (411,421). A first ohmic contact (431) couples one n+ regions (422) to one p+ region (425). A second ohmic contact (433) couples another n+ region (412) to another p+ region (415) to provide physically and electrically symmetrical low-voltage p-n-p-n silicon controlled rectifiers. A deep isolation trench (419) surrounding the SCR device (41) and dopant concentration profiles provide a low capacitance SCR design for protecting high frequency integrated circuits from electrostatic discharges.

8 Claims, 6 Drawing Sheets

SYMMETRICAL HIGH FREQUENCY SCR STRUCTURE

BACKGROUND OF THE INVENTION

This invention relates, in general, to integrated circuit structures, and more particularly to a low trigger voltage symmetrical SCR structure for protecting high frequency integrated circuits from electro-static discharges (ESD).

High frequency (1 GHz and greater) integrated circuits are well known and used, for example, in personal communication applications such as cellular telephones, pagers, and personal digital assistant (PDA) devices. As the personal communications industry is pushed towards smaller and lighter products, the components and chips that make up these products must also become smaller and lighter.

ESD is a well-known and documented problem in integrated circuit (IC) manufacturing. ESD occurs when large voltage pulses from static electricity are applied to the pads of integrated circuits. ESD voltage spikes may cause damage to insulating layers and conductive interconnects, which can result in short and/or open circuit failures and overheating. Additionally, such spikes can damage the junctions causing cross diffusion and melting.

ESD protection has emerged as a major design challenge in high frequency applications such as radio frequency (RF) integrated circuits. In RF IC applications, higher failure voltages and smaller available areas for placing an ESD structure on an IC are driving factors for ESD performance levels.

Additionally, an ESD load often dominates the parasitic capacitance (typically in the range of 1–8 pF), which becomes a significant problem at operating frequencies around 1 to 2 GHz. ESD device parasitic capacitance slows signals down, causes large reflections, and limits chip-to-chip signal bandwidth. As a result, a significant part of a signal is lost through ESD circuits, which makes them a major obstacle for high-speed operation.

In narrowband IC designs, it is known in the prior art to use a package/bond wire inductance technique to resonate out parasitic capacitance. However, this approach is not applicable to broadband designs, and thus, ESD parasitic capacitance continues to be a major problem in broadband applications. High frequency devices such as RF IC's often do not include ESD structures because of the capacitive loading problem, and are thus, very susceptible to damage and/or failure.

Accordingly, a need exists for a low voltage ESD structure having an acceptable capacitive load (i.e., less than about 0.1 to 0.2 pF) for high frequency applications (i.e., 1 GHz to 10 GHz). Further, it would be beneficial for the ESD structure not to consume too much chip real estate, and to be easily integrated into a chip fabrication process.

DETAILED DESCRIPTION OF THE DRAWINGS

In general, the present invention provides an SCR device suitable for high frequency (greater than 1 Hz) ESD protection. The SCR device comprises a symmetrical low trigger voltage structure. In a preferred embodiment, the structure is integrated into a high frequency bipolar IC process flow, and is isolated from the internal circuitry it protects with a deep isolation trench structure, field dielectrics, and low-doped regions and layers. One can better understand the present invention by referring to FIGS. 1–10 together with the following detailed description of the drawings.

Figure 1:
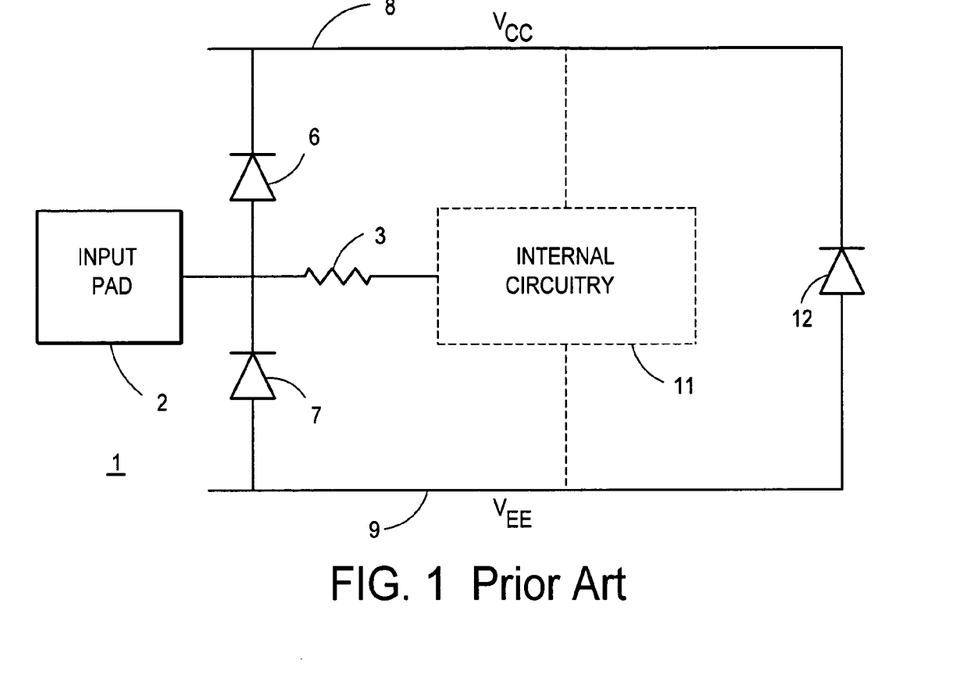
FIG. 1 is a circuit diagram of a prior art input ESD structure.

FIG. 1 is a simplified circuit diagram of a prior art high frequency input ESD structure 1. ESD structure 1 protects input pad 2 with two reverse biased Zener diodes 6 and 7, where Zener diode 6 is coupled from signal to a $V_{CC}$ bus 8, and Zener diode 7 is coupled from signal to a $V_{EE}$ bus 9. Additionally, a series resistor 3 (approximately 100 ohms) is coupled to input pad 2, Zener diodes 6 and 7, and internal circuitry 11. Zener diode 12 is coupled to $V_{CC}$ bus 8 and $V_{EE}$ bus 9 and provides a power clamp or central protection device for internal circuitry 11.

Figure 2:
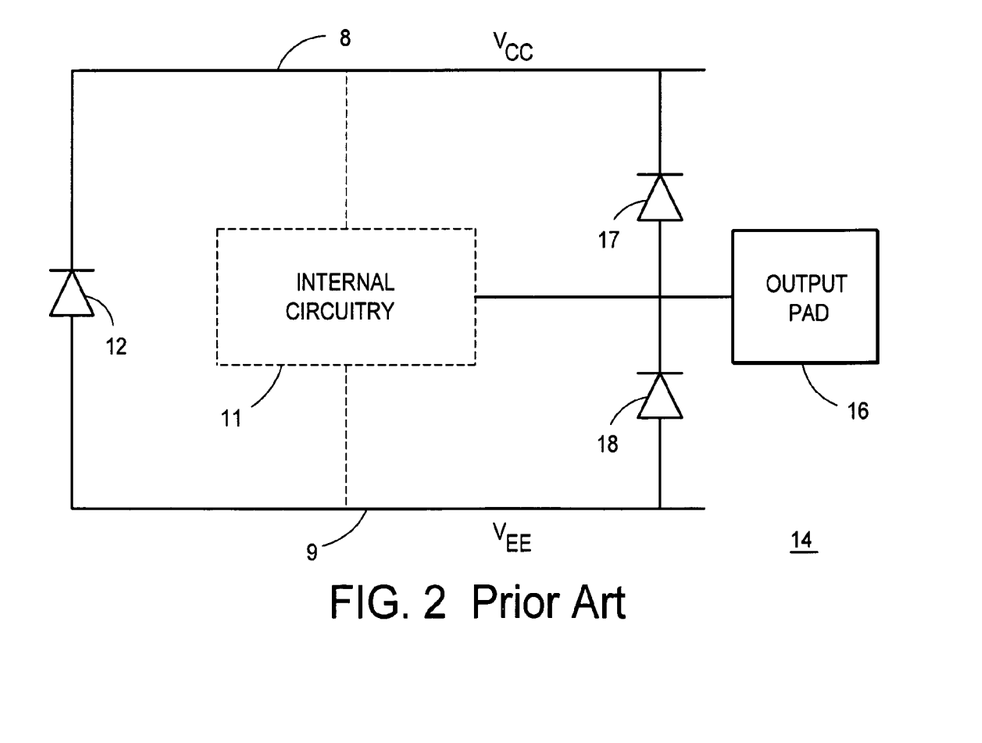
FIG. 2 is a circuit diagram of a prior art output ESD structure.

FIG. 2 is a simplified circuit diagram of a prior art high frequency output ESD structure 14. ESD structure 14 protects an output pad 16 with two reverse biased Zener diodes 17 and 18, where Zener diode 17 is coupled from signal to $V_{CC}$ bus 8, and Zener diode 18 is coupled from signal to $V_{EE}$ bus 9. Zener diodes 6, 7, 12, 17 and 18 have a breakdown voltage of about 7 volts. Zener diode 12 typically is twice the area of Zener diodes 6, 7, 17 and 18.

Figure 3:
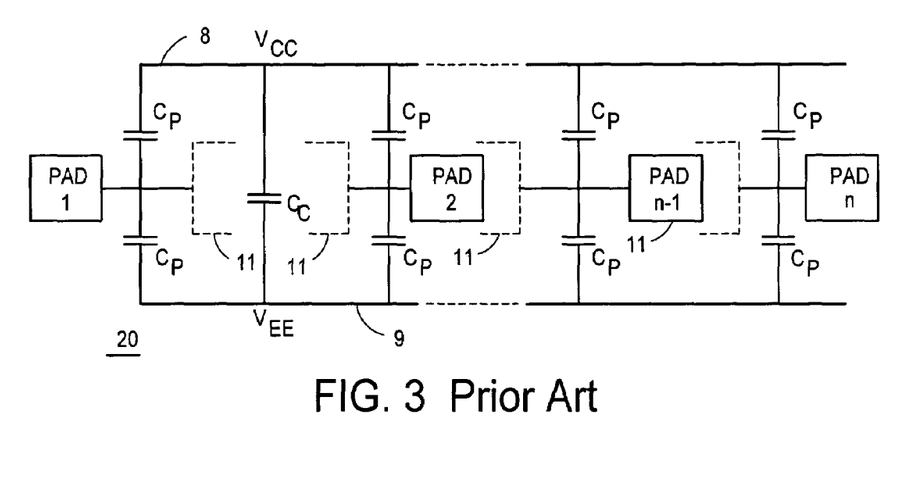
FIG. 3 is simplified equivalent capacitance circuit including the ESD structure of FIG. 1.

FIG. 3 shows an equivalent capacitance circuit 21 of an ESD protection structure including ESD structure 1 where load capacitances of protected internal circuitry are ignored. The parasitic capacitance of a given input/output pad can be estimated by the following formula:

$$C_{Pad/VCC}=C_{Pad/VEE}=[(m+1)C_P+2C_C]/[1+(m/2)+(C_C/C_P)] \quad (1)$$

In the above formula, m=n−1, $C_P$ is the capacitance of an ESD protection device (e.g., Zener diodes 6, 7, 17, and 18), $C_C$ is the capacitance of a central protection ESD device (e.g., Zener diode 12 ), and n is the number of input/output pads in a given circuit. As can be seen from the formula, the parasitic input/output capacitance of a given $C_{pad/Vcc}$ tends to $2C_p$, and does not depend on the central protection device capacitance $C_C$ or the number of pads n.

In the ESD structures of FIG. 1 and FIG. 2, the capacitance of a Zener diode (e.g., diodes 6, 7 and 18) alone is on the order of 0.9 pF, and the parasitic capacitance load at a given pad ($C_{Pad/Vcc}$) is greater than 1.8 pF. This value of parasitic capacitance becomes a significant problem for RF applications because, among other things, it limits chip-to-chip bandwidth and causes signal loss through the ESD structure.

Additionally, bias dependant diode junction capacitance is an issue with ESD structure 1 because the input capacitance varies when an input signal has different voltage levels. This can cause a threefold degradation in signal quality for a voltage swing of 0 to $V_{CC}$ (i.e., 5 volts). For high precision circuit operations, an input capacitance of an analog pin must be kept as constant as possible within an input voltage swing. The input capacitance variation of ESD structure 1 causes an increase in harmonic distortion in analog-to-digital converter applications, and thus, degrades the precision of the device.

SCR devices have been proposed as ESD devices in CMOS integrated circuits. SCR devices have several advantages including their high energy absorbing capability and their small size (i.e., they take up less space on chip compared to conventional devices such as ESD structure 1). Additionally, SCR's have low dynamic on-resistance and low power dissipation compared to diodes, MOS transistors, and bipolar transistors.

Figure 4:
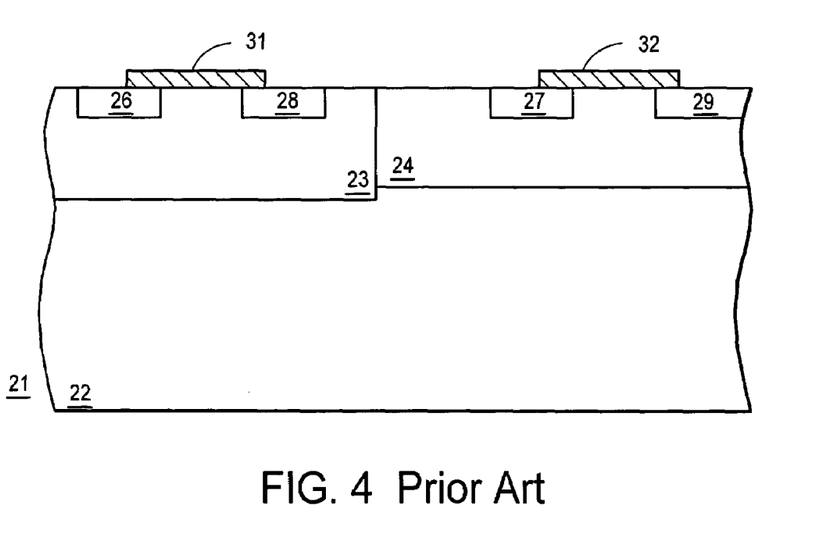
FIG. 4 illustrates an enlarged cross-sectional view of a prior art SCR ESD structure.

However, unless certain precautions are taken, SCR devices also have several disadvantages. FIG. 4 shows a cross-sectional view of a prior art CMOS based SCR ESD device 21, which is used to illustrate such disadvantages. Device 21 includes a p-type substrate 22, an n-well 23, and a p-well 24 in contact with n-well 23. Device 21 further includes n+ regions 26 and 27, and p+ regions 28 and 29. A contact 31 couples n+ region 26, n– well 23, and p+ region 28, and a contact 32 couples n+ region 27, p-well 24, and p+ region 29.

SCR device 21 has a relatively high trigger voltage $V_t$ on the order of 20 to 25 volts because of low-doped n-well 23 and p-well 24, which typically have doping levels on the order of $1.0 \times 10^{17}$ atoms/cm$^3$. This becomes a problem as IC geometries shrink below 0.8 microns because gate oxide failure voltages become close to the lowest junction breakdown voltage of typical SCR devices. At the 0.8 micron level, worst case gate oxide breakdowns occur in the 10 to 12 volt range, and naturally triggered or typical SCR devices like device 21 require about a 20 to 25 volt transient to turn on. Such a trigger voltage is too high to protect current and future device geometries.

Another disadvantage of SCR device 21 is its tendency to remain in an "on" state because of parasitic triggering in normal operations from effects such as noise, fast pulse rates, or the like. Also, if circuit connections to SCR device 21 are capable of supplying current in excess of the SCR's holding current, it remains in a conductive, clamped state when a transient is finished. This can produce catastrophic results on an ESD device or an IC structure the ESD device is supposed to protect. As a result of these disadvantages, SCR device 21 cannot be used by itself to protect I/O pads.

Several modifications and solutions have been proposed to overcome the deficiencies of SCR device 21. For example, an additional n+ or p+ region is placed between n-well 23 and p-well 24 to reduce the breakdown voltage, which in turn, reduces the trigger voltage. Alternatively, a gate grounded NMOS transistor or PMOS transistor is added to reduce the breakdown voltage between n-well 23 and p-well 24.

In addition, control circuits that include series diodes and MOS transistors have been proposed to increase holding voltage over a particular supply bias. Also, control circuits including diodes and grounded gate MOS transistors have been proposed to increase holding current over a particular operating current. Key disadvantages of these proposed solutions include a larger required area on the chip for ESD structure integration, and an increase in the ESD structure's load capacitance, which is directly contrary to the high frequency IC design requirements set forth above.

Turning now to the present invention, the authors propose a symmetrical silicon controlled rectifier (SCR) structure to solve the problems and challenges set forth in prior art. The proposed structure is symmetrical in order to, among other things, protect for positive and negative HBM ESD stress.

FIGS. 5–10 show a preferred embodiment of an SCR structure suitable for ESD protection in high frequency IC applications. The key advantages of the device according to the present invention are its reduced trigger voltage, low capacitance, ability to out perform prior art configurations, and its small size. Additionally, the SCR device according to the present invention is conveniently implemented in a standard high frequency bipolar flow thereby minimizing any impact of ESD device integration. The dopant profiles described in a preferred embodiment provide an SCR device that has a trigger voltage on the order of 9 to 10 volts, and a clamping voltage on the order of 6 to 7 volts. The profiles are adjusted to provide other desired trigger and clamping voltage characteristics.

Figure 5:
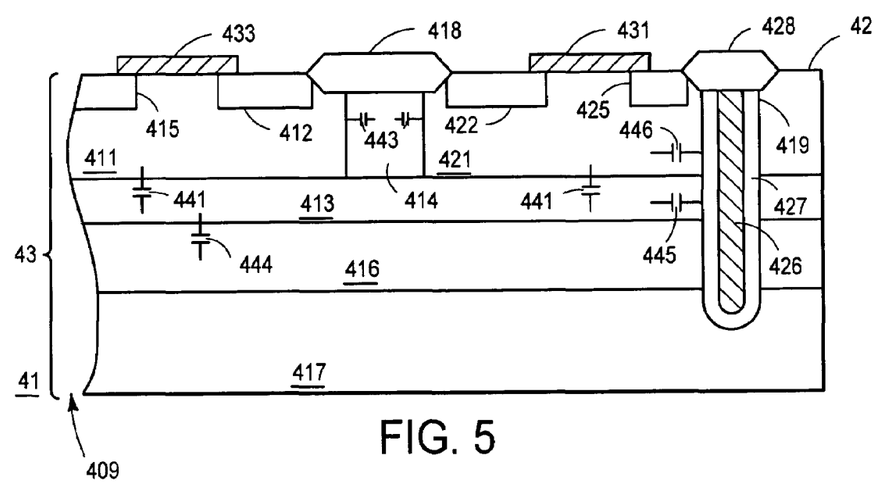
FIG. 5 illustrates an enlarged cross-sectional view of an SCR structure according to the present invention.

FIG. 5 illustrates an enlarged cross-sectional view of an SCR structure or device 41 in accordance with the present invention. SCR structure 41 is designed, for example, as an ESD structure for protecting I/O pads and power rails with a reduced load capacitance for high frequency applications. Additionally, SCR structure 41 is designed to provide a flatter capacitance-voltage (C–V) characteristic.

SCR structure 41 comprises symmetrical p-n-p-n SCR devices, and includes a p+ semiconductor wafer or layer 417 having a preferred dopant concentration on the order of $4.0 \times 10^{17}$ to $6.0 \times 10^{17}$ atoms/cm$^3$, a lightly doped p-layer or region 416 on or over p+ layer 417, an n+ buried layer or region 413 on or over p– layer 416, and n– layer or region 414 formed on or over n+ buried layer 413. Together, p+ layer 417, p– layer 416, buried layer 413, and n– layer 414 form a semiconductor substrate or body of semiconductor material 43.

According to the present invention, n+ buried layer 413 is maintained floating (i.e., not directly coupled to a power rail or ground) to ensure a symmetrical DC breakdown voltage response, and to decrease load capacitance. In addition, n+ buried layer 413 reduces by approximately half the maximum transient voltage bias clamp that results from an ESD event. This allows a very fast and efficient ESD protection, and further reduces required ESD device area on a chip.

Preferably, p– layer 416 has a dopant concentration of about $1.0 \times 10^{13}$ atoms/cm$^3$ and a thickness of about 1.5 to 3.0 microns. N+ buried layer 413 has a dopant concentration of about $8.0 \times 10^{19}$ atoms/cm$^3$ and a thickness of about 0.75 to 1.75 microns. N– layer 414 has a dopant concentration of about $2.0 \times 10^{16}$ atoms/cm$^3$ and a thickness of about 0.8 to 1.2 microns. P– layer 416 is formed using conventional epitaxial growth techniques. N+ buried layer 413 is formed using conventional masking, deposition, and doping/diffusion techniques, or alternatively, with epitaxial growth techniques. N– layer 414 is formed using, for example, conventional epitaxial growth techniques.

A first p– well 411 and a second p-well 421 are formed within n– layer 414, and are spaced apart leaving a portion of n– layer 414 between the two p-wells. Preferably, p– wells 411 and 421 are spaced a distance of about 3.0 to about 4.0 microns apart. P-wells 411 and 421 preferably have a peak concentration on the order of $3.0 \times 10^{18}$ atoms/cm$^3$ and are diffused to a depth to contact n+ buried layer 413 (about 0.9 to about 1.2 microns). P− wells 411 and 421 are formed using conventional masking, doping and diffusion techniques, and preferably are formed at the same time.

A deep isolation trench 419 separates or isolates SCR structure 41 from the internal circuitry it protects. Deep isolation trench 419 extends from a surface 42 of SCR structure 41 into p+ layer 417, and is filled with a deposited dielectric 427 such as a deposited oxide (e.g., a tetraethylorthosilicate (TEOS) oxide) and a floating doped polycrystalline silicon layer 426 (e.g., p+ doped polysilicon). Deep isolation trench 419 preferably is capped with a field dielectric layer 428.

A field dielectric layer 418 separates p− wells 411 and 421, and has a thickness on the order of 0.6 microns. Field dielectric layers 418 and 428 comprise a silicon oxide for example, and are formed using conventional masking and oxide growth techniques (e.g., LOCOS isolation techniques). Field dielectric layer 418 together with a portion of n− layer 414 isolates first p-well 411 and second p− well 421. Additionally, the deep isolation trenches and field dielectric layers form a plurality of active regions on semiconductor substrate 43 where ESD structures (e.g., SCR structure 41) and other circuitry (e.g., internal circuitry 53 shown in FIG. 9) are formed.

N+ regions or doped regions 412 and 422 are formed in first p− well 411 and second p− well 421 respectively. P+ regions or doped regions 415 and 425 are formed in first p− well 411 and second p− well 421 respectively, and are spaced apart from n+ regions 412 and 422. Preferably, n+ regions 412 and 422 are formed at the same time, and p+ regions 415 and 425 are formed at the same time. A first ohmic contact 431 is formed over n+ region 422 and p+ region 425 thereby electrically coupling regions 422 and 425, and second ohmic contact 433 is formed over n+ region 412 and p+ region 415 thereby electrically coupling regions 412 and 415.

P+ regions 415 and 425 have a surface concentration of about $2.0 \times 10^{20}$ atoms/cm$^3$ and a depth of about 0.2 to about 0.3 microns. N+ regions 412 and 422 have a surface concentration of about $1.0 \times 10^{21}$ atoms/cm$^3$ and a depth of about 0.1 to about 0.2 microns. By way of example, p− well 411, p+ region 415, n+ region 412, and ohmic contact 433 form an anode of SCR structure 41, and p-well 421, p+ region 425, n+ region 422, and ohmic contact 431 form a cathode of SCR structure 41. According to the present invention, the built-in resistances of p-wells 411 and 421 and n+ buried layer 413 ensure a relatively high holding voltage ($V_h$), which allows SCR device 41 to overcome the tendency of conventional SCR devices to remain in a clamped "on" state when parasitic triggering events occur.

SCR structure 41 is symmetrical about axis 409, which bisects p− well 411, with only half of it shown in FIG. 5. The anode and cathode sides of the device are junction isolated with n− layer 414, which is also isolated from the top with field dielectric layer 418. SCR structure 41 is further junction isolated from p+ substrate 417 with low-doped p− layer 416, which ensures a very low capacitance 444. Additionally, deep trench 419 provides a low capacitance (i.e., capacitances 445 and 446) lateral isolation of SCR structure 41 from the protected internal circuitry (shown in FIG. 9). Parasitic capacitances 443 and 444 are parallel to main device capacitances 441 connected in series. Capacitances 445 and 446 are serial and paralleled to a lower part of the circuit (i.e., cathode side).

The equivalent capacitance circuit of SCR device 41 ensures a very flat capacitance voltage characteristic (shown in FIG. 8), which provides a significant improvement over the prior art. The overall reduction in capacitance of SCR structure 41 is due to its smaller junction area and the series connected capacitances 441 of the p-n junctions between layers 411/413 and 421/413. Additionally, the flatness of the C-V characteristic results from the series capacitances of SCR structure 41. For example, during a positive bias, one junction becomes depleted causing its capacitance to decrease because of an increase in space charge width. The other junction remains unchanged, and thus, its capacitance is kept quasi-constant. Thus, the decrease in capacitance of SCR structure 41 capacitance is less compared to ESD structure 1, which is a one junction device. A negative bias alters the role of the polarized junctions, but the overall SCR capacitance retains a tendency to decrease slightly. In comparison, diode junction in ESD structure 1 becomes accumulated, which causes its space charge width to decrease. This results in a strong increase in capacitance.

Figure 6:
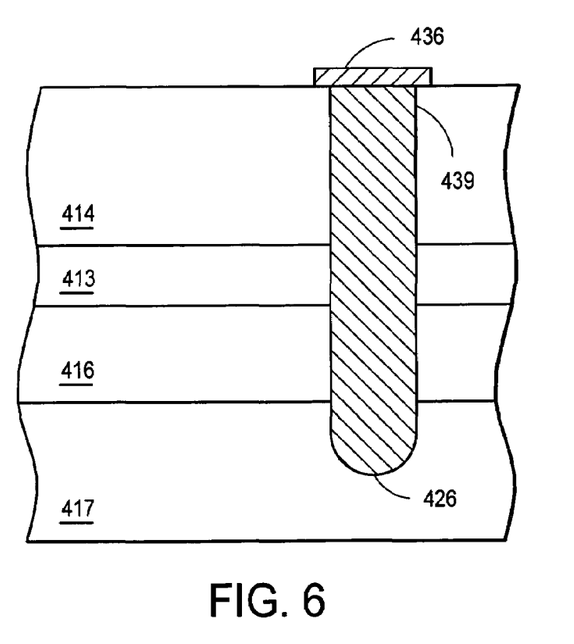
FIG. 6 illustrates an enlarged cross-sectional view of another portion of the structure of FIG. 5.

FIG. 6 illustrates an enlarged cross-sectional view of another portion of SCR structure 41. P+ layer 417 preferably is coupled to the $V_{EE}$ bus via a deep contact trench 439. Deep contact trench 439 is filled with a polycrystalline silicon layer 426 (e.g., p+ doped polysilicon).

As shown in FIG. 5, the cathode and anode sides of SCR structure 41 are physically symmetrical low-voltage p-n-p-n thyristors in terms of device DC current-voltage characteristics and ESD operation. That is, the two SCR devices have symmetrical IV characteristics in DC and transients modes of operation. Regions and layers 415, 411, 413, 421 and 422 form one p-n-p-n device, and regions and layers 425, 421, 413, 411 and 412 from a second p-n-p-n device.

SCR structure 41 has excellent isolation properties. Using trench isolation (e.g., deep isolation trench 419), which surrounds SCR structure 41, leakage current levels are negligible. This reduces any probability of latch-up into internal circuitry that is near SCR structure 41 (shown as internal circuitry 53 in FIG. 9). Additionally, high-doped p+ layer 417 and the deep p+ doped polysilicon filled deep trench substrate contact to $V_{EE}$ or ground provide an efficient barrier to reduce any substrate current injection and crosstalk mechanisms with adjacent internal circuitry.

The following table summarizes a comparison of device performance between ESD structure 1 (prior art) and SCR structure 41:

| Device | BV | ESD Stress | $V_{tr}$ | Min $V_h$ | C-V Swing $C_{max}/C_{min}$ | $C_{load}$ @0 V | Efficiency $C_{diode}/C_{load}$ | Area $\mu m^2$ |
|---|---|---|---|---|---|---|---|---|
| 1 | 7.8 V | 2 kV | 7.5 V |  | 2.19 | 0.88 pF | 1 | 1064 |
| 41 | 8 V | 3.25 kV | 8.8 V | 5.5 V | 1.23 | 0.28 pF | 2.5–4.28 flat | 640 |

Where, BV is DC breakdown voltage, $V_{tr}$ is the trigger voltage (shown in FIG. 10 as point 61 on the IV curve), Min $V_h$ is the minimum holding voltage (shown in FIG. 10 as point 62 on the IV curve), C-V Swing is a ratio of maximum to minimum capacitance, $C_{load}$ is the load capacitance of the ESD device, Efficiency is normalized with respect to ESD device 1, and Area includes total area of the ESD device without pads.

Figure 7:
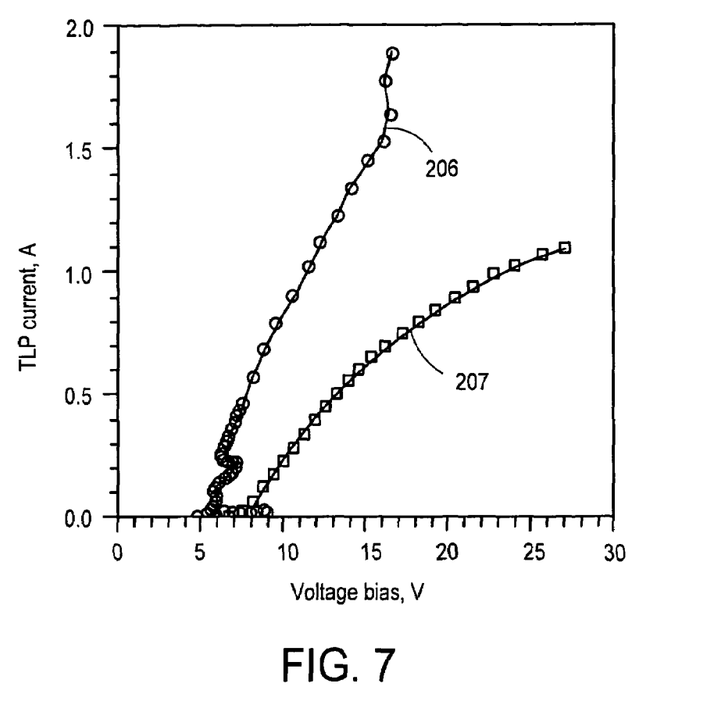
FIG. 7 is a graph of transmission line pulse current versus ESD stress voltage comparing the SCR structure of FIG. 5 to the prior art ESD structure of FIG. 1.
Figure 8:
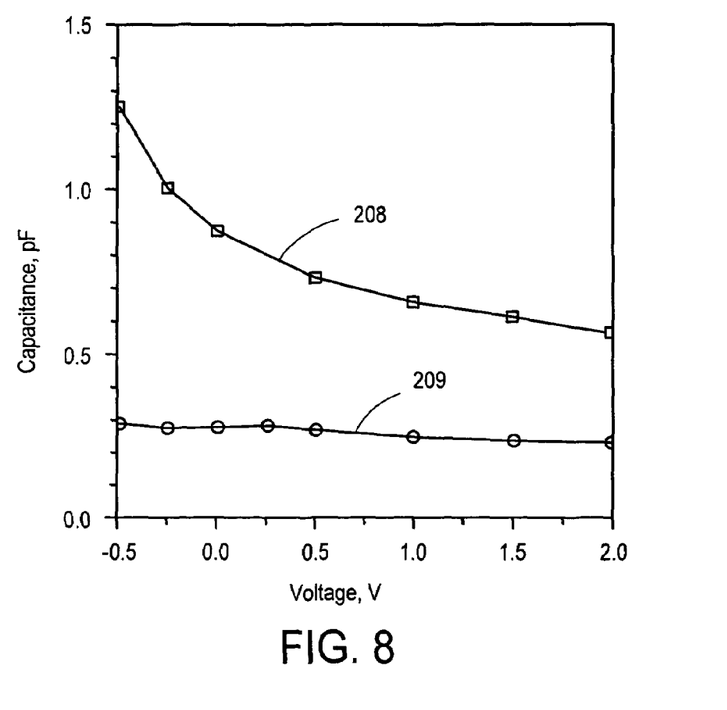
FIG. 8 is a graph of capacitance versus voltage comparing the SCR structure of FIG. 5 to the prior art diode structure of FIG. 1.

FIG. 7 is a graph of transmission line pulse (TLP) current versus voltage comparing SCR structure 41 (line 206) to ESD structure 1 (line 207). As shown in FIG. 7, SCR device 41 shows a maximum TLP bias voltage of 11 volts at 1 amp, while ESD device 1 shows a maximum TLP bias voltage of 24 volts at 1 amp. FIG. 8 is a graph that shows a capacitance versus voltage bias comparison between ESD structure 1 (line 208) and SCR structure 41 (line 209). In both FIG. 7 and 8, the device area of ESD structure 1 is 1064 $\mu m^2$, and the device area of SCR structure 41 is 640 $\mu m^2$.

FIGS. 7 and 8 together with the above Table illustrate the enhanced performance of SCR structure 41 compared to prior art high frequency ESD structure 1. SCR structure 41 shows an improved robustness in terms of sustained ESD threshold voltage stress. In addition, the device capacitance is approximately half. Also, the input capacitance of SCR structure 41 remains almost constant, even when input voltage swings from 0 to $V_{CC}$ (5V). Additionally, the device area of SCR structure 41 is approximately 60% that of ESD structure 1.

Figure 9:
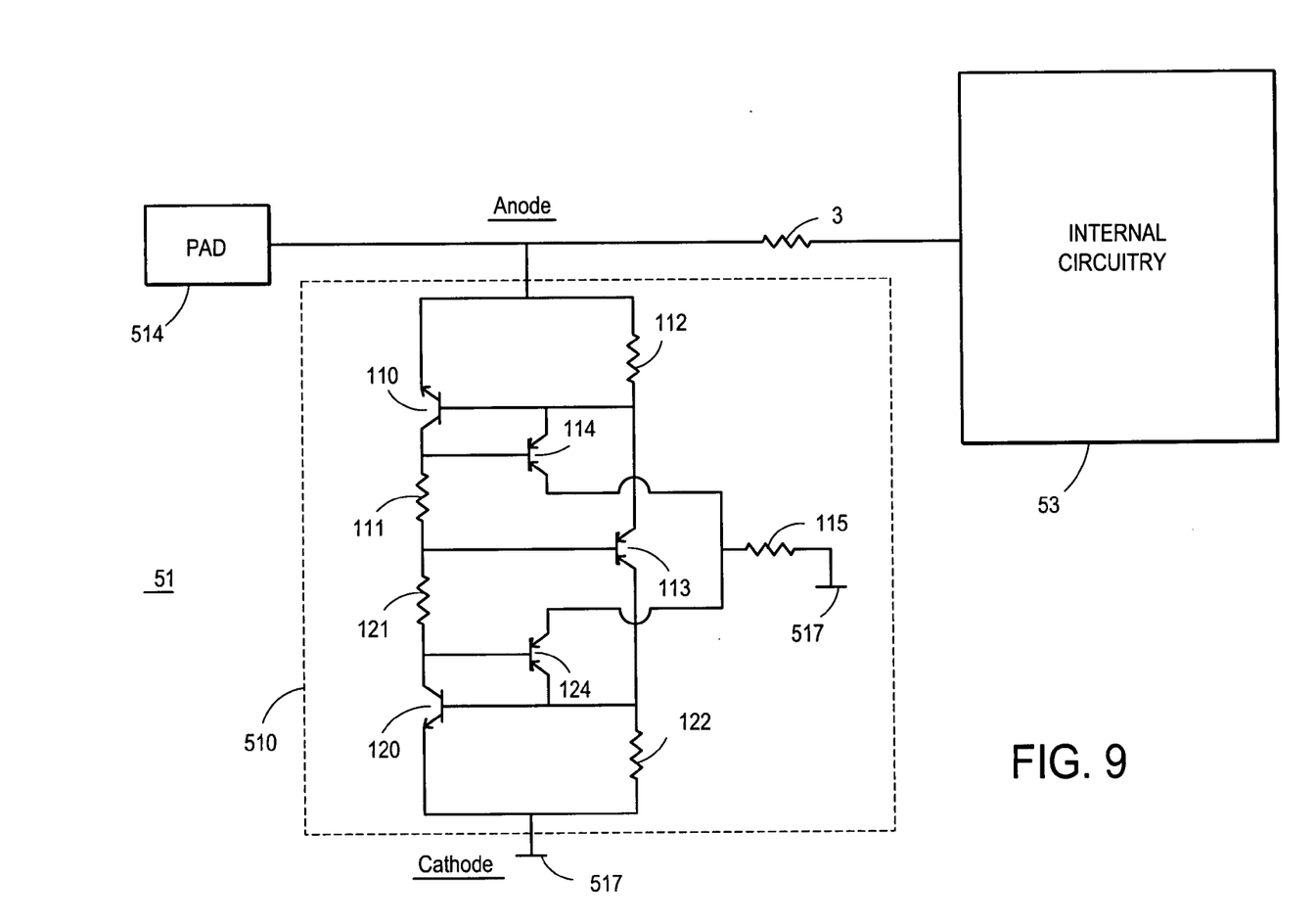
FIG. 9 is a circuit diagram of a high frequency integrated circuit structure including an SCR structure according to the present invention.

FIG. 9 shows an equivalent circuit of a high frequency integrated circuit device 51 that includes I/O ESD protection circuit 510, I/O pad 514, $V_{EE}$ or ground bus 517, and internal circuitry 53. ESD protection circuit 510 includes two symmetrical low voltage trigger SCR (SLVTSCR) devices according to the present invention. Circuit 510 is coupled to an I/O pad 514 and a $V_{EE}$ bus 517. Although not shown, in a full implementation, a second ESD protection circuit similar to 510 is coupled to I/O pad 514 and a $V_{CC}$ bus or power rail. Internal circuitry 53 comprises for example, bipolar power amplifier devices, logic devices, interstage matching network devices, and/or the like.

ESD protection circuit 510, I/O pad 514, $V_{EE}$ bus 517, and internal circuitry are formed on a semiconductor substrate, such as substrate 43 shown in FIG. 5, where the term "on" means the structures are within substrate 43, over substrate 43 (such as overlying isolation regions), and/or contacting upper surface 42 of substrate 43.

Referring back to FIG. 5, n+ region 412, p− region 411 and n+ buried layer 413 form respectively an emitter, base and collector of n-p-n vertical transistor 110 (shown in FIG. 9). N+ region 422, p− region 421, and n+ buried layer 413, form respectively, an emitter, base, and collector of symmetrical n-p-n vertical transistor 120. N+ buried layer 413 and n− layer 414 form an n-type base, and p+ regions 415 and 425 form respectively, the emitter/collector regions of p-n-p lateral bipolar transistor 113. Resistors 112 and 122 are formed, respectively, from the distributed resistance of p− regions 411 and 421.

Resistors 111 and 121 are formed, respectively, from the distributed resistance of n+ buried layer 413 and n− layer 414. Vertical p-n-p transistor 114 is formed from p+ substrate 417 (emitter/collector), n+ buried layer 413 (base) and p− regions 415/411 (collector/emitter), where resistor 115 is the distributed resistance of p+ substrate 417. Second vertical p-n-p transistor 124 is formed from p+ substrate 417 (emitter/collector), n+ buried layer 413 (base) and p− layers 425/421 (collector/emitter).

Structure 510 forms a functional circuit block with two terminals, working in combination separately, i.e., devices 110, 114, and 113 in one direction, and 120, 124, and 113 in the opposite direction, respectively, to protect internal circuitry 53 against ESD stress. The DC breakdown voltages of the base/collector and/or base/emitter junctions of p-n-p devices 113 are about 7 volts. Under normal conditions (i.e., operation voltage <$V_{CC}$), ESD device 51 is off with only negligible leakage currents flowing in the circuit.

By way of example, consider a mode where I/O pad 514 is connected to the anode, and $V_{EE}$ bus 517 is coupled to the cathode. If a positive ESD stress is considered at I/O pad 514 with respect to $V_{EE}$, the p-n junction formed between regions 411 and 413 is forward biased, and the p-n junction between regions 421 and 413 is reverse biased. At the same time, the p-n junction between layers 413 and 416 becomes reverse biased. The latter p-n junction has a very high breakdown voltage (>50 volts) because of low-doped p-layer 416.

When the reverse bias exceeds the avalanche breakdown of the p-n junction formed by p− well 421 and n+ buried layer 413 (around 7 volts DC), the current through transistor 113 increases and additional carriers (electron-hole pairs) are generated. The generated holes accelerate in p− well 421 and p+ region 425, and are collected by ohmic contact 431 (i.e., the cathode). Because of hole drift along these p doped regions, the voltage drop across resistor 122 increases.

When the voltage bias at the p-n junction between p− well 421 and n+ region 422 exceeds 0.6–0.7 volts, the base/emitter junction of n-p-n transistor 120 becomes forward biased and the SCR device turns on. As the collector current across resistor 121 increases, the voltage drop at the base/collector of p-n-p transistor 113 decreases. As a result, the device is turned on and triggers into snap back. The device according to the present invention forms a very low impedance path between the electrodes, and the ESD induced current is evacuated into the protection circuit instead of internal circuitry 53. During a positive stress bias, transistor 124 is not turned on because the breakdown voltage of the reverse biased base/collector junction is very high. Thus, only a small amount of current flows through transistor 124.

Figure 10:
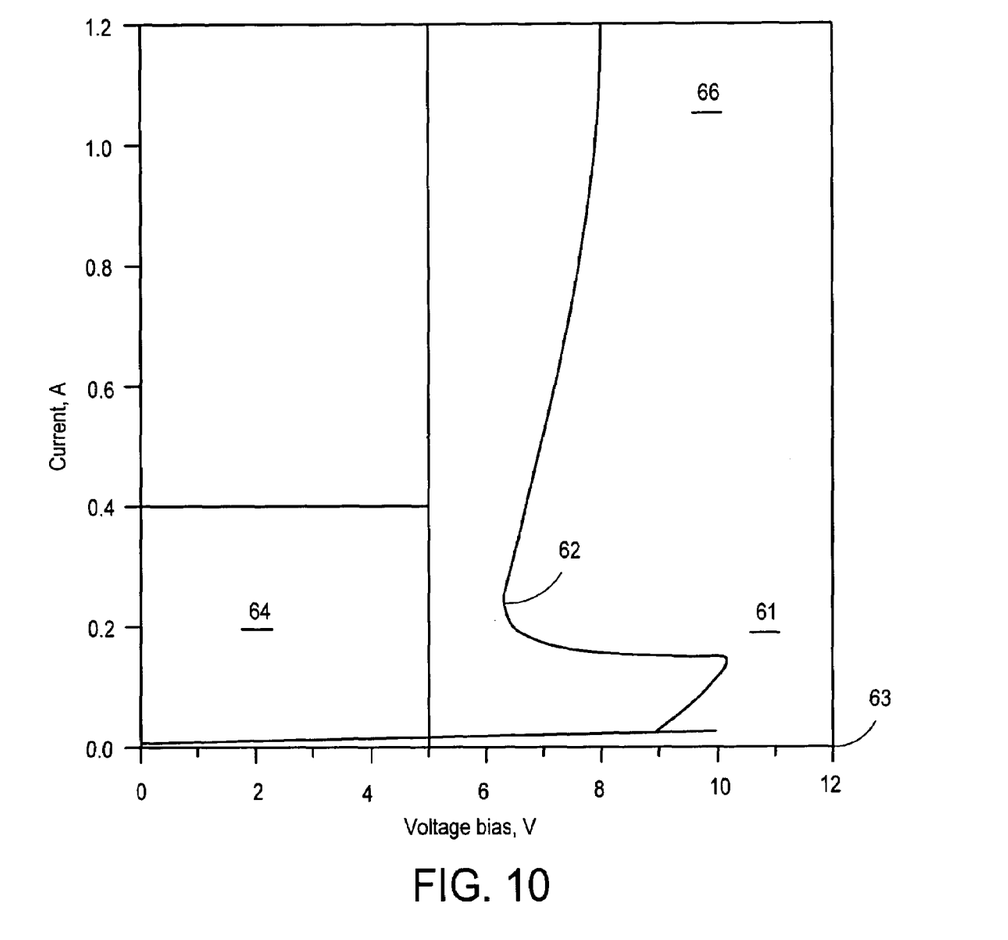
FIG. 10 is a graph of a transient current/voltage (I-V) characteristic of an SCR structure according to the present invention.

FIG. 10 shows a transient I-V characteristic for an SCR device from ESD structure 51, which results from a transient bias. Point 61 on the IV curve represents the trigger voltage and current ($V_{tr}$ and $I_{tr}$), and point 62 represents the holding voltage and current ($V_h$ and $I_h$). Point 63 represents a maximum voltage above which failure of internal circuitry occurs. Region 64 represents a preferred I-V operation area, and region 66 represents an ESD design window. The characteristic for an negative stress is symmetrical according to the present invention to the one shown in FIG. 10.

The robustness of ESD structure 51 results from, among other things, two critical parameters: 1) a trigger voltage $V_t$ of approximately 9 to 10 volts and a trigger current $I_t$ of approximately 0.02 amps on one side of the device, and 2) a holding voltage $V_h$ of about 6 to 7 volts and a holding current $I_h$ of about 0.2 amps, on the other side of the device. When the voltage bias between electrodes increases beyond $V_h$, ESD structure 51 enters a snap back mode (i.e., it is turned on), and thus, a lower voltage is needed to sustain the current circulating across the device, corresponding to a negative resistance.

Beyond the holding voltage, a low-impedance mode of the device maintains a sharp I-V characteristic, and provides for low power dissipation in the device. This feature of the invention helps ESD structure 51 to sustain higher ESD threshold stress, and also is responsible for the robustness of ESD protection circuit design. Additionally, ESD structure 51 has a fast response to ESD stress. The time from turn-off to turn-on (low impedance mode) takes about 1 nanosecond, and the design does not allow the device to overheat, which is a problem with the prior art.

Thus it is apparent that there has been provided, in accordance with the present invention, a symmetrical SCR protection device for high frequency ESD applications. The disclosed device has a low trigger voltage (i.e., 9–10 volts), low capacitance (less than 0.3 pF), out performs prior art Zener diode configurations, and it has a small size. Because of its low capacitance, the SCR device according to the present invention reduces signal losses, does not cause large signal reflections, and does not limit chip-to-chip bandwidth. Additionally, the symmetrical SCR protection device is conveniently implemented in a standard high frequency bipolar integrated circuit process flow. Moreover, the SCR device according to the prevention is implemented without the additional diode or MOS transistor devices and control circuitry required by prior art SCR ESD structures.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A high frequency integrated circuit structure comprising:
    a body of semiconductor material having a plurality of isolated active regions, and comprising a first conductivity type;
    internal circuitry formed in a first active region;
    a second active region comprising a buried layer of a second conductivity type formed over the body of semiconductor material and a first semiconductor layer of the second conductivity type formed over the buried layer, wherein the first semiconductor layer has a lower dopant concentration than the buried layer;
    a first silicon controlled rectifier device formed in the second active region, the first silicon controlled rectifier device comprising a first well region of the first conductivity type formed in the first semiconductor layer, a first doped region of the first conductivity type formed in the first well region, the buried layer, a second well region of the first conductivity type formed in the first semiconductor layer and spaced apart from the first well region, and a second doped region of the second conductivity type formed in the second well region; and
    a second silicon controlled rectifier device comprising the second well region, a third doped region of the first conductivity type formed in the second well region, the buried layer, the first well region, and a fourth doped region of the second conductivity type formed in the first well region, wherein the first and second silicon controlled rectifier devices are coupled to the internal circuitry and form an ESD structure for protecting the internal circuitry against positive and negative ESD stresses.

2. The high frequency integrated circuit structure of claim 1 wherein the body of semiconductor material comprises:
    a semiconductor wafer having the first conductivity type; and
    a second semiconductor layer formed over the semiconductor wafer, wherein the second semiconductor layer comprises the first conductivity type, and wherein the second semiconductor layer has a lower dopant concentration than the semiconductor wafer, and wherein the buried layer is formed adjacent the second semiconductor layer.

3. The high frequency integrated circuit device of claim 2 further comprising:
    a first ohmic contact coupling the first and fourth doped regions; and
    a second ohmic contact coupling the second and third doped regions.

4. The high frequency integrated circuit device of claim 2 further comprising a deep contact trench extending from a surface of the first semiconductor layer into the semiconductor wafer.

5. The high frequency integrated circuit device of claim 1 further comprising a field dielectric region formed on a surface of the first semiconductor layer between the first and second wells.

6. The high frequency integrated circuit structure of claim 2, wherein the second semiconductor layer has a dopant concentration of approximately $1.0 \times 10^{13}$ atoms/cm$^3$.

7. The high frequency integrated circuit structure of claim 2, wherein the second semiconductor layer has a thickness from about 1.5 microns to about 3.0 microns.

8. The high frequency integrated circuit structure of claim 1 further comprising a deep isolation trench formed in the body of semiconductor material for isolating the ESD structure from the internal circuitry, wherein the deep isolation trench includes a dielectric layer.

* * * * *